United States Patent
Sandford et al.

(10) Patent No.: US 6,175,579 B1
(45) Date of Patent: Jan. 16, 2001

(54) APPARATUS AND METHOD FOR LASER FREQUENCY CONTROL

(75) Inventors: Stephen P. Sandford, Yorktown; Charles W. Antill, Jr., Newport News, both of VA (US)

(73) Assignee: Precision Light L.L.C., Roseland, NJ (US)

(*) Notice: Under 35 U.S.C. 154(b), the term of this patent shall be extended for 0 days.

(21) Appl. No.: 09/179,210

(22) Filed: Oct. 27, 1998

(51) Int. Cl.$^7$ ........................................................ H01S 3/13
(52) U.S. Cl. ........................................................... 372/32

(56) References Cited

U.S. PATENT DOCUMENTS

| | | | |
|---|---|---|---|
| 4,184,127 | 1/1980 | Green et al. | 331/94.5 S |
| 4,468,773 | 8/1984 | Seaton | 372/32 |
| 4,592,058 | 5/1986 | Mongeon et al. | 372/32 |
| 4,660,206 | 4/1987 | Halmos et al. | 372/28 |
| 4,856,010 | 8/1989 | Wissman et al. | 372/32 |
| 4,953,169 | 8/1990 | Schlemmer et al. | 372/32 |
| 4,977,565 | 12/1990 | Shimosaka | 372/32 |
| 5,048,031 | 9/1991 | Thonn | 372/33 |
| 5,068,864 | 11/1991 | Javan | 372/32 |
| 5,084,884 | 1/1992 | Terada | 372/29 |
| 5,161,165 | 11/1992 | Zorabedian | 372/20 |
| 5,185,751 | 2/1993 | Hale | 372/18 |
| 5,339,324 | 8/1994 | Eguchi et al. | 372/29 |
| 5,390,203 | 2/1995 | Miller | 372/29 |
| 5,509,023 | 4/1996 | Glance et al. | 372/20 |
| 5,625,633 | 4/1997 | Ichimura et al. | 372/32 |
| 5,642,375 | 6/1997 | King et al. | 372/97 |
| 5,646,774 | 7/1997 | Takara et al. | 359/340 |
| 5,684,623 | 11/1997 | King et al. | 359/346 |
| 5,717,708 | 2/1998 | Mells | 372/32 |

*Primary Examiner*—Teresa M. Arroyo
*Assistant Examiner*—Gioacchino Inzirillo
(74) *Attorney, Agent, or Firm*—Lerner, David, Littenberg, Krumholz & Mentlik, LLP (57) ABSTRACT

An apparatus and method of controlling the frequency of laser outputs are provided. The apparatus includes an optical resonator having an optical length that supports a plurality of resonant modes dependent thereon. The optical resonator includes a modulation device for modulating the optical length in response to a modulation signal. A first and second laser having a respective first and second optical output at a respective first and second laser frequencies are independently locked to different resonant modes of the optical resonator using known locking mechanisms to produce first and second laser outputs having narrow linewidths. A beatnote generator generates a beatnote signal representative of the difference between the first and second frequencies of the first and second laser outputs. A negative feedback system having a reference signal and the beatnote signal as inputs generates the modulation signal representative of a difference between the reference and beatnote signals. The modulation signal so produced acts to correct for changes in the optical length of the optical resonator by actuating the modulation device so as to maintain a fixed optical length and thereby stabilize and control the first and second optical outputs.

37 Claims, 3 Drawing Sheets

APPARATUS AND METHOD FOR LASER FREQUENCY CONTROL

This invention was made with support of the National Aeronautics and Space Administration. The United States Government has certain rights in the invention as set forth in 37 C.F.R. 501.6(a)(2).

FIELD OF THE INVENTION

The present invention relates generally to an apparatus and method of laser frequency control. More particularly, the present invention is directed to apparatus and methods for achieving optical laser outputs having narrow linewidths and stable laser frequencies.

BACKGROUND AND OBJECTS OF THE INVENTION

Lasers which produce outputs having stable frequencies are widely accepted as reference signal sources used for many scientific, commercial, industrial and military applications. For example, such lasers may be used in a broad array of precision measurements as well as communication systems and other systems which require precise timing. It is desirable for lasers used in such applications to produce optical outputs having a very narrow linewidth and, ideally, center frequencies which exhibit long-term stability. For environmentally demanding applications, such as space-based applications, low power, compact systems are also desirable.

A number of laser control techniques have demonstrated either good center frequency stability or a narrow linewidth. Linewidth, as such term is used herein and in the art, refers to the overall spectral content of the laser output (i.e., frequency spectrum) rather than any resolution of the laser output (i.e., lines/millimeter).

The generally known Pound-Drever-Hall (PDH) locking scheme, for example, provides a very narrow linewidth laser output by matching the output to a very sharp resonant mode of a high finesse optical cavity. The PDH laser system facilities locking of the laser output to an independently selected resonant cavity frequency through feedback control. The PDH feedback control corrects for mechanical variations in both the optical cavity length and laser cavity length due to, for example, temperature based or acousto-mechanical displacements of the mirrors located at the laser and cavity ends. To achieve a stable lock, it is further desirable for the optical resonator of the PDH system to possesses a high finesse, which exists when the reflectivities of the mirrors comprising the optical resonator are very high (i.e. low optical loss from the resonator). Mathematically the finesse is simply the free spectral range (FSR) of the resonator (i.e. the frequency difference between adjacent axial modes) divided by its full-width at half-maximum frequency response (spectral linewidth). Lasers with sub-Hertz relative linewidths have been reported by PDH locking a laser to a high finesse optical resonator.

Prior art solutions for achieving the long-term frequency stability of laser systems have included the use of atomic or molecular resonators as frequency references. Prior art systems and methods most often accomplish this by locking the laser frequency to an atomic transition using absorption information obtained by passing the laser light through a gas cell. The advantage of locking a laser to atomic transitions is that atomic transitions are highly stable frequency references. However, the need for a gas cell and the corresponding limit on achievable linewidth using practical gas pressures and temperatures are disadvantages of these laser systems for environmentally demanding and high reliability applications, such as spaceflight. In addition, this approach is limited to lasers with frequencies near those of molecules that can be practically utilized and are therefore not tunable. This limits the laser to be controlled to a frequency corresponding to a strong atomic transition in the gas. Furthermore gas cells are not rugged and typically require a large apparatus to accomplish laser control.

Other prior art techniques for stabilizing the long-term frequency of a laser rely on the locking of an optical cavity to a radio frequency (RF) oscillator by locking a single phase modulated laser and one side band to the n-th and n-th+1 order of the cavity. This limits the free spectral range of the cavity to be such that a phase modulator can be built at that frequency. This method of laser locking suffers at least three drawbacks. First, the method works well for long cavities with relatively small FSRs but poorly for compact systems with a FSR>100 MHz in which noise from the external reference limits the stability of the cavity length. Second, noise associated with laser phase modulators, especially at higher frequencies (>100 MHz), limits the performance of this technique. Third, this laser locking system suffers from the same disadvantage as all others in that it controls some aspect of the laser itself, such as the cavity length or other intercavity element, to set its frequency. Consequently, the two frequencies used to lock the cavity, the laser output frequency and that same laser's RF sideband are themselves phase-locked and, therefore, must be insensitive to certain changes in the optical cavity length. Finally, RF laser locking techniques require a phase modulator with a high bandwidth, thereby implying high power and an inefficient implementation.

Therefore, the need exists for apparatus and methods of achieving a compact laser frequency control system, which consumes minimal power, has an optical laser output with a narrow linewidth and is capable of being designed with almost any output wavelength. Furthermore, methods and apparatus for a compact laser frequency stabilization system in which the long term laser output frequency stability is controlled independently of the linewidth stabilization apparatus is desirable.

Accordingly, it is an object of the invention to provide a laser control system which provides a narrow output laser linewidth and a temporally stable laser center frequency.

It is a further object of the invention to provide a stable reference oscillator having a narrow frequency spectrum and a temporally stable center frequency.

SUMMARY OF THE INVENTION

The present invention fulfills these needs by providing a laser frequency control apparatus comprising an optical resonator having an optical length and a plurality of resonant modes dependent upon the optical length. The apparatus also comprises a first laser system including a first laser output at a first laser frequency and a first laser locking mechanism. The first laser locking mechanism is adapted to modulate the first laser output so as to lock that output at a first laser frequency corresponding to a first resonant mode of the optical resonator. The apparatus further comprises a second laser system including a second laser output at a second laser frequency and a second laser locking mechanism. The second laser locking mechanism is adapted to modulate the second laser output so as to lock that output at a second laser frequency corresponding to a second resonant mode of the optical resonator. A beatnote generator is arranged to receive the first and second laser outputs and produce a beatnote signal representative of the difference between the first and second laser frequencies. The beatnote signal and a reference signal are input to a negative feedback system which acts to lock the reference signal to the beatnote signal and produce a modulation signal representative of a difference between the two signals. The modulation signal actuates a modulation device attached to the optical resonator so as to modulate the optical length of the optical resonator and maintain a specific optical length. The negative feedback system, through the beatnote signal, completes the feedback path to the optical resonator so as to lock the optical resonator to the reference signal.

In a preferred embodiment of the present invention, at least one of said first and second resonant modes is an axial mode of the optical resonator. Alternatively, at least one of the first or second resonant modes may be either an off-axis mode or a degenerate off-axis mode.

In another embodiment the present invention, an optical conditioning system is provided operatively arranged to condition at least one of the first and second laser outputs. The optical conditioning system may comprise at least one beam combiner, adapted to coalign the first and second laser outputs. The optical conditioning system may also comprise an optical distribution mechanism adapted to distribute at least one of said first or second laser outputs to an application system removed from said laser frequency control apparatus.

It is also preferable for the laser frequency control apparatus of the present invention to comprise a negative feedback system having a phase-locked loop. The phase-locked loop preferably contains an electronic oscillator adapted to produce the reference signal and a modulation signal representative of a difference between the beatnote and reference signals.

In another preferred embodiment, the beatnote generator of the invention includes a photodetector. Also preferably contained within the beatnote generator is an electronic mixer or a scaler coupled between the beatnote generator and negative feedback system and adapted to mix down or scale down a beatnote signal center frequency.

It is also preferable for the negative feedback system to include an electronic oscillator comprising a natural oscillator and a clock scaler adapted to produce the reference signal matched with the beatnote signal center frequency. The electronic oscillator may also include a stabilization mechanism adapted to stabilize the natural oscillator. The negative feedback system also preferably comprises an integral feedback portion and a proportional feedback portion.

In still a further embodiment of the present invention, the optical resonator is comprised of a material having a low coefficient of thermal expansion. Further, the optical resonator may be less than about 100 mm long and may have a finesse greater than about 5,000.

It is desirable for the laser frequency control apparatus to be relatively compact. To this end, the entire laser frequency control apparatus preferably may occupy a volume less than about 2,700 $cm^3$.

In another preferred embodiment of the present invention, at least one of the first and second laser locking mechanisms include a Pound-Drever-Hall locking mechanism. In addition, the modulation device may comprise an optical length transducer operatively coupled to said resonator and adapted to modulate the optical length in response to the modulation signal. The optical length transducer preferably comprises a piezoelectric material. Additionally, the first and second laser systems are preferably diode-pumped ring lasers.

In preferred applications employing the frequency control apparatus of the invention, at least one of the first and second laser outputs is input to a long-baseline interferometer adapted to measure a distance. Applications may include using at least one of the first and second laser outputs or the beatnote signal as a stable reference input into a communications system. Additionally, the first or second laser outputs may be input to a frequency measurement system to measure the optical frequency of another laser.

In accordance with another aspect of the present invention a method of obtaining a controlled laser frequency is provided. The method comprises the steps of providing a first laser output having a first laser frequency and locking the first laser frequency to a first resonant mode of optical resonator. A second laser output having a second laser frequency is also provided and the second laser frequency is locked to a second resonant mode of the optical resonator. A beatnote signal representative of the difference between the first and second laser frequencies is produced and is input along with a reference signal into a negative feedback system. A modulation signal is produced representative of the difference between the beatnote and reference signals. The beatnote and reference signals are locked with the negative feedback system, and a modulation device is actuated responsive to the modulation signal to modulate an optical length of the optical resonator so as to lock the optical resonator to said reference signal.

The step of locking at least one of the first and second laser frequencies preferably comprises the step of applying the Pound-Drever-Hall method.

In accordance with a preferred step of the present method, an additional step of conditioning at least one of the first and second laser outputs is provided. The step of conditioning the first and second laser outputs may comprise the steps of coaligning the first and second laser outputs, and inputting the coaligned first and second laser outputs to an optical distribution mechanism after the optical resonator and the reference signal are locked. Further, the step of locking the beatnote signal to a reference signal may comprise the sequential steps of achieving a quasi-steady-state lock with an integral feedback portion of the negative feedback system, followed by achieving a steady-state lock with a proportionate controlled portion of the negative feedback system. Additionally, the method of the present invention may also include the step of mixing or scaling a center frequency of the beatnote signal during the step of producing the beatnote signal so as to preserve information related to changes in the optical length of the optical resonator.

The present method may also include the step of utilizing at least one of the first and second laser outputs to measure a distance after locking the optical resonator to the reference signal.

The method may also include the step of utilizing at least one of the first and second laser outputs to establish a communications system frequency reference after locking the optical resonator to the reference signal. Further, the method may include the step of mixing at least one of the first or second laser outputs with another laser output to determine the frequency of the other laser output.

DETAILED DESCRIPTION OF A PREFERRED EMBODIMENT

Figure 1:
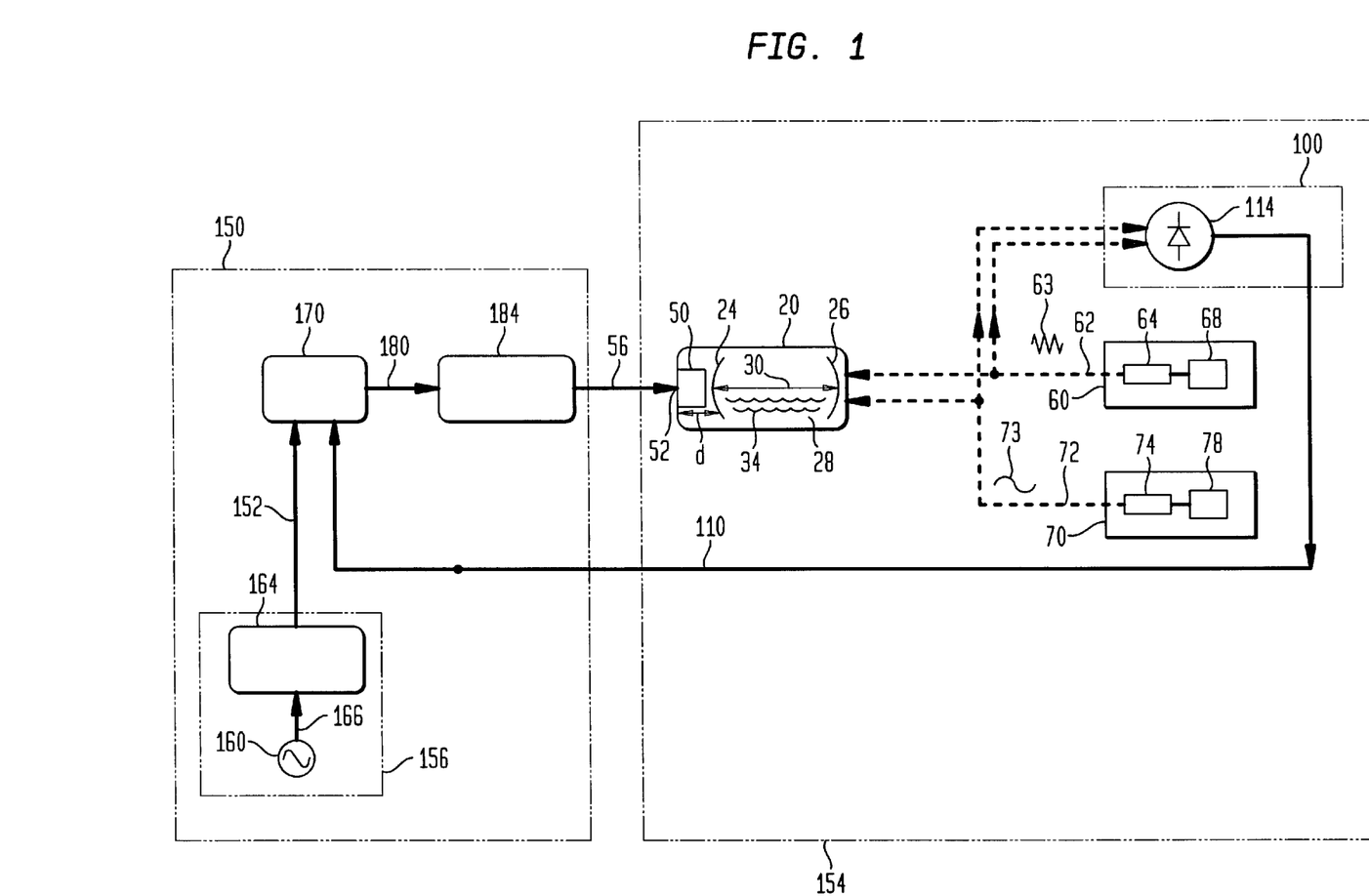
FIG. 1 depicts a block diagram of a laser frequency control and stabilization apparatus in accordance with a preferred embodiment of the present invention.

FIG. 1 shows block diagram of a laser frequency control and stabilization apparatus according to one preferred embodiment of the invention. The laser apparatus includes tunable optical resonator 20, which may be a Fabry-Perot interferometer, an etalon, a ring resonator or other suitable optical cavity. Optical resonator 20 may be made of glass or other material having a low coefficient of thermal expression.

In the preferred embodiment shown in FIG. 1, optical resonator 20 includes two highly reflective mirrors 24 and 26 mounted at either end of an internal optical cavity 28 of the resonator. The mirrors are chosen to be highly reflective such that the finesse of the optical resonator is large, typically greater than 5,000 and preferably greater than 80,000, making the optical resonator a low loss system. The optical resonator preferably has a relatively short optical length 30 for compact applications. Optical length 30 is determined by the distance traveled by a light beam propagating between the two mirrors 24 and 26 mounted to the ends of optical resonator 20 and the index of refraction of the gas between the mirrors 24 and 26.

The FSR of optical resonator 20 is given by the equation:

$$FSR = c/2L \tag{1}$$

where c=the speed of light, and L equals the optical path length. From this equation, an exemplary optical resonator having optical length 30 of about 56 mm has a nominal FSR of approximately 2.67 GHz. From equation (1), it is evident that extremely small changes in a small optical path length 30 of optical resonator 20 will result in significant changes in the laser frequencies supported therein. In particular, optical resonator 20 supports numerous axial resonant modes 34 under locked conditions as given by the equation:

$$m\lambda = 2L \tag{2}$$

where m is the mode number, L is the optical path length and $\lambda$ is the wavelength of the resonant frequency $v$ ($=c/\lambda$). Optical resonator 20 is also capable of supporting off-axis resonant modes or other degenerate off-axis modes, such non-axial resonant modes not being confined to propagating along axial optical path 30.

Also included within optical resonator 20 is a modulation device 50 disposed at one end of the optical resonator 20 and behind mirror 24. Modulation device 50 includes an optical length transducer affixed to the inside end 52 of optical resonator 20 and the back of mirror 24. The optical length transducer is adapted to modulate the optical length 30 by varying the distance of the mirror 24 from optical resonator end 52 generally in the dimension marked "d" (FIG. 1) in response to input modulation signal 56. Modulation device 50 may include various known modulation services such as a piezoelectric stack capable of modulating the optical length 30 by at least half of the wavelength of the desired resonant mode as given by equation (2) above. Such modulation range makes mode matching of a laser incident to optical resonator 20 much simpler since a full FSR can be scanned. Finally, other electro-mechanical or electro-optical transducers, such as electrostrictive devices, may also be employed in modulation device 50 to modulate the optical path 30 in response to input modulation signal 56.

As further shown in FIG. 1, at least two application lasers, first laser system 60 and second laser system 70, are physically aligned with respect to optical resonator 20 so as to direct their respective first and second optical laser outputs, 62 and 72, as inputs to the optical resonator 20. First and second laser systems 60 and 70 each include respective first and second lasers 64 and 74 which provide optical outputs 62 and 72 at respective first and second laser frequencies 63 and 73. Lasers 64 and 74 may be diode-pumped ring lasers, flash-lamp pumped lasers, gas lasers or other narrow frequency optical output generators. Diode pumped ring lasers are preferred since they are compact, efficient and their narrow linewidth optical outputs are particularly suited for locking to the optical resonator using PDH techniques. A typical laser 64 and 74 is a Lightwave Electronics model 120-01A having 5 mW of output power at a nominal wavelength of 1064 nm.

Laser systems 60 and 70 also include laser locking systems 68 and 78 respectively, operatively associated with the first and second lasers 64 and 74. Laser locking systems 68 and 78 include optics and electronic circuitry necessary to lock-the laser outputs 62 and 72 of the first and second lasers 64 and 74 to two different resonant modes of optical resonator 20 according to known locking mechanisms. In a preferred embodiment of the invention, laser locking systems 68 and 78 use the above-mentioned PDH technique and employ a negative feedback servoloop to modulate the cavity lengths of lasers 64 and 74 to effect changes in their individual output frequencies.

First and second laser outputs 62 and 72 are thereby modulated to lock the first and second laser frequencies 63 and 73 to adjacent axial modes of the optical resonator 20 with locking mechanisms 68 and 78 respectively. Each PDH locking mechanism includes a number of components disposed as described in "Laser Phase and Frequency Stabilization Using an Optical Resonator", Applied Physics B, Vol. 31, 97–105 (1983), R. W. P. Drever, J. L. Hall, F. V. Kowalski, J. Hough, G. M. Ford, A. J. Munley and H Ward, which contents are incorporated herein by reference. Although the most sensitive detection of changes to optical path length 30 is achieved by locking lasers 64 and 74 to axial modes of optical resonator 20, either of lasers 64 or 74 may be locked instead to an off-axis or a degenerate off-axis mode of optical resonator 20 using known locking mechanisms 68 and 78.

It should be noted that although the lasers and locking systems are described together above, it is not required that both lasers or both locking mechanisms need to be identical for the apparatus and methods of the invention to function properly.

Laser outputs 62 and 72 are subsequently fed as inputs to beatnote generator 100. Beatnote generator 100 contains optical and electronic elements to provide an output beatnote signal 110 representative of the difference between the first and second laser output frequencies 63 and 73 of laser outputs 62 and 72. Optical elements within beatnote generator 100 may include a photodetector 114, as shown in the preferred embodiment of FIG. 1. Photodetector 114 outputs beatnote signal 110 having a center frequency equal to the difference between the first and second laser output frequencies 63 and 73.

Beatnote signal 110 represents an interferomic measurement of optical length 30 within optical resonator 20 and is also a direct measure of the FSR of the optical resonator as given by equation (1) above. By taking a first derivative of the equation for the optical resonator FSR and substituting the conditions for optical path resonance as shown in the equation (2) above, it can be determined that changes in the optical length 30 are directly reflected by changes in the center frequency of the beatnote signal according to the following relationship:

$$-\frac{d(v)}{d(L)} = \frac{md(FSR)}{dL} = \frac{-mc}{2L^2} \quad (3)$$

where all variables are the same as in equations (1) and (2) above. As such, the beatnote center frequency, being dependent on the optical length 30, is essentially a carrier of information regarding changes in the optical length 30.

Negative feedback system 150 accepts beatnote signal 110 as an input and outputs modulation signal 56 to actuate modulation device 50 and vary the optical length 30 in response to variations in the beatnote signal. In the particular embodiment of FIG. 1, negative feedback system 150 acts to phase-lock a stable, independent frequency reference signal 152 with beatnote signal 110 and provides a compensating output in the form of modulation signal 56 so as to correct for changes in the optical length 30 and to maintain a specific desired optical length 30 as governed by equation (2) above. Maintenance of the locked relationship between reference signal 152 and optical resonator 20 allows the two laser outputs 62 and 72 to be locked to a very stable optical resonator and thereby produce stable and narrow linewidth laser output frequencies 63 and 73. It is apparent from this that the stability of the frequency reference signal 152 is one component of the system noise which results in noise error in the stabilization of the optical resonator.

Negative feedback system 150 may include any suitable negative feedback circuitry or optics, including one or more optical or electrical phase-locked loops (PLL), subject to the bandwidth and feedback requirements of the system as set forth in this invention. In the preferred embodiment of FIG. 1, negative feedback system 150 is illustrated as a digital PLL (DPLL) with input beatnote signal 110 functioning as the output of the PLL voltage controlled oscillator (VCO) portion 154. The VCO portion of the DPLL is shown in FIG. 1 as comprising optical resonator 20, first and second laser systems 60 and 70, and beatnote signal generator 100. Stable frequency reference signal 152 for the DPLL is provided by electronic oscillator 156, which includes a natural oscillator 160 and clock scaler 164. In FIG. 1, natural oscillator 160 provides a highly stable frequency output 166 which is input to clock scaler 164. Clock scalar 164 divides or multiplies signal 166 appropriately to match the center frequency of beatnote signal 110. A typical natural oscillator 160 is an oven controlled quartz crystal and provides a stable frequency output of 5 or 10 MHz.

Figure 2:
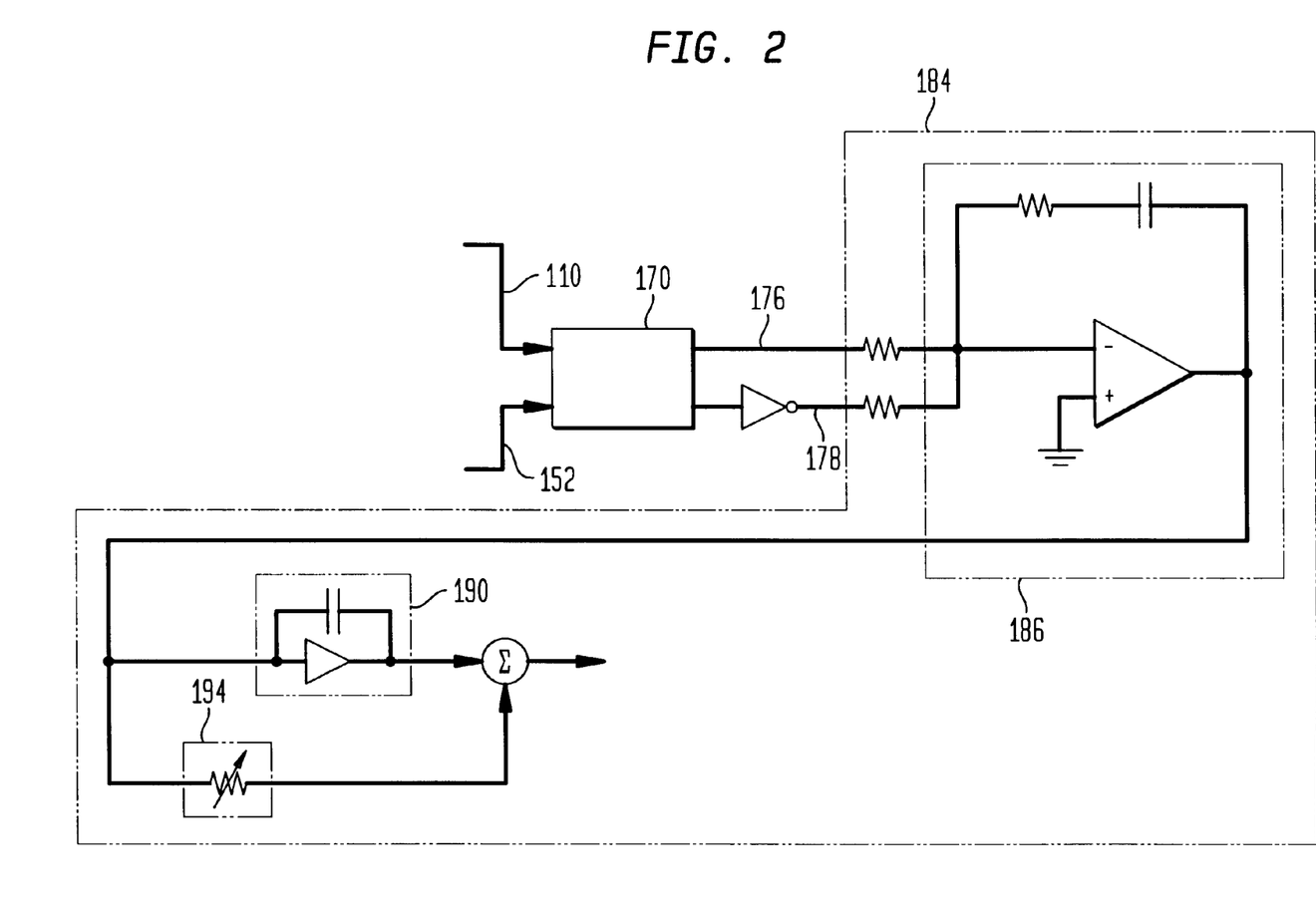
FIG. 2 illustrates a functional block diagram of a portion of a negative feedback system of the laser frequency control and stabilization in accordance with a preferred embodiment of the present invention.

As shown in FIG. 1, DPLL negative feedback system 150 further includes phase detector 170 which accepts the stable frequency reference signal 152 and beatnote signal 110 as inputs and outputs phase adjustment signal 180 to loop filter 184 (shown in more detail in FIG. 2). Phase detector 170 operates to calculate the frequency or phase difference between its inputs 152 and 110 and outputs a frequency or phase adjustment signal 180 representative of the changes required in either of the two inputs to cause them to be matched in frequency or phase. Off-the-shelf integrated circuits, such as the Motorola MC4044, can provide the functions necessary for the phase locking of the reference input 152 and beatnote signal 110.

Referring to FIG. 2, a schematic of the DPLL negative feedback system 150 is shown. Frequency reference signal 152 is input to phase detector 170 along with beatnote signal 110. Phase detector 170 provides a first output 176 and a second inverted output 178 for inputting into loop filter 184. The preferred embodiment of loop filter 184 consists of feedback elements 186, 190 and 194. Feedback portion 186 provides some integral and some proportional feedback. Integral feedback portion 190 and proportional feedback portion 194 both accept the output of feedback element 186 and are introduced sequentially to permit the DPLL to achieve phase lock. In particular, the strong integral feedback portion 190 is introduced to bring the system to a quasi-steady-state before the proportional feedback portion 194 is introduced to fully lock the system.

All of the electrical, electromechanical and optical components of the present invention, as described in the drawings and specification, may be low power devices desirably made from solid-state components. In a preferred embodiment where the present invention is a compact system, the entire system may be arranged within a housing of about 2700 cm3. Such a compact system may weigh less than about 10 kg.

The frequency control and stabilization methods of the present invention, have achieved first and second laser output frequencies having subhertz relative linewidths of less than about 390 mHz and a long-term stability that closely track those of the reference input and the oscillator within the mixer or scaler.

Figure 3:
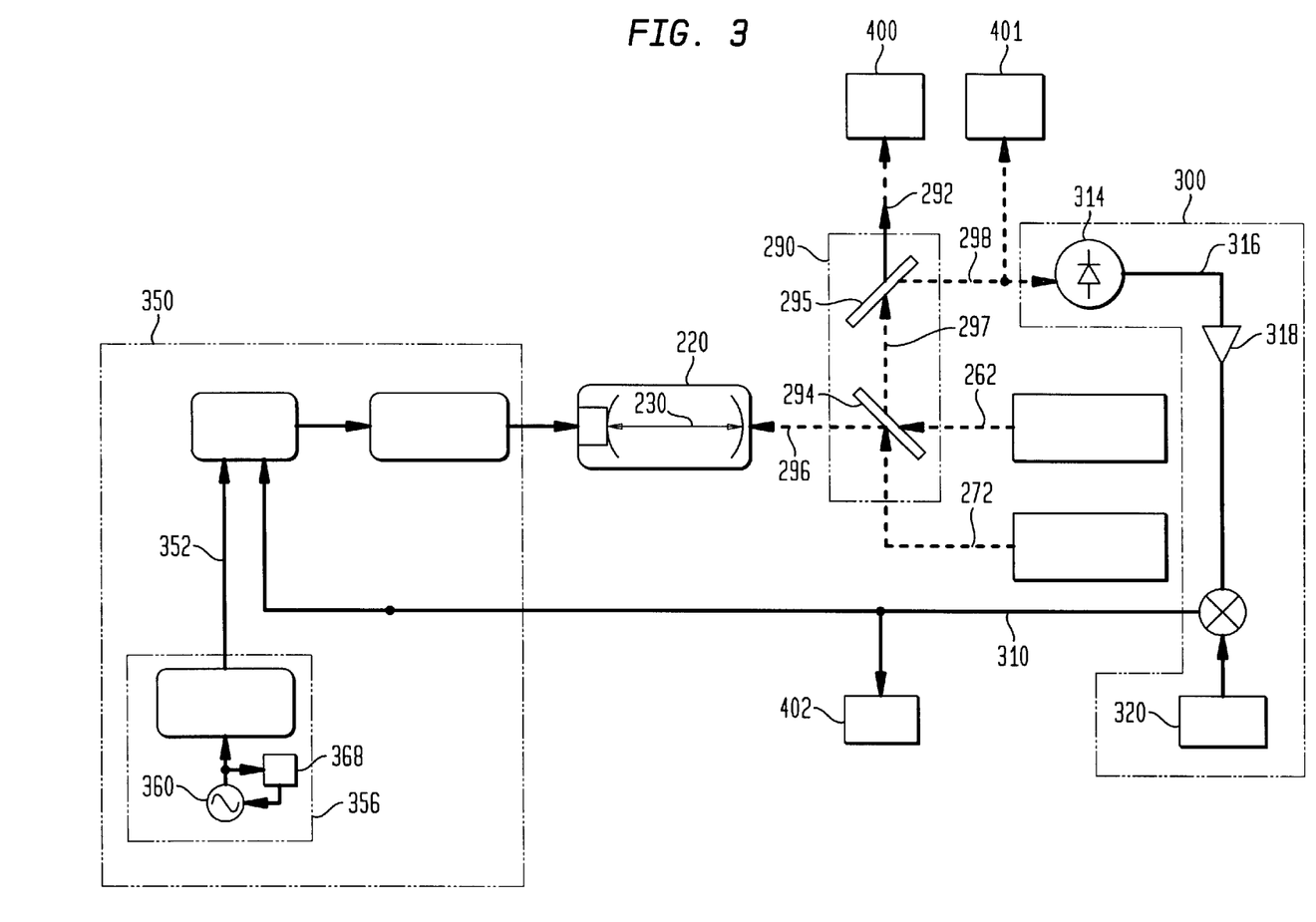
FIG. 3 depicts a block diagram of a laser frequency control and stabilization apparatus in accordance with another embodiments of the present invention.

FIG. 3 illustrates an alternative embodiment of the present laser control apparatus where an optical conditioning system 290 is included in the system of the present invention to coalign and/or direct the first and second laser outputs 262 and 272 having respective first and second frequencies so as to provide an appropriate input to optical resonator 220, a useful optical laser output 292 or an input to beatnote signal generator 300. For example, a beam combiner 294, having two optical inputs, laser outputs 262 and 272, and two identical optical outputs, 296 and 297, consisting of the optical combination of laser outputs 262 and 272, may be used to coalign laser outputs 262 and 272 and direct their combined output into optical resonator 220. Second output 297 of beam combiner 294 may then be directed to second beam combiner 295 which directs the combined optical output 298 of laser outputs 262 and 272 to beatnote signal detector 300 and, useful output 292 for input to other applications or systems 400 or 401. Other optical and electro-optical devices may of course be employed within optical conditioning circuitry 290 to direct, coalign or otherwise manage first and second laser outputs 262 and 272.

Also shown in FIG. 3, beatnote generator 300 may contain additional optical and electronic elements as necessary to condition the beatnote signal 310. For example, an amplifier 318 may be used to elevate the raw beatnote signal 316 from photodetector 314 to an appropriate value for further use in electronic circuitry within beatnote generator 300. In addition, it may also be desirable to modulate the center frequency of the beatnote signal to keep the bandwidth of negative feedback system 350, the recipient of the beatnote signal, relatively small. This is desirable to simplify the design of the negative feedback system 350 and facilitate a more homogeneous match of the beatnote signal 310 to reference inputs 352 having lower frequencies. In this regard, mixer 320 may be used to mix down (or up if needed) the center frequency of raw beatnote signal 316. A Hewlett-Packard 83732A frequency synthesizer, for example, works well in mixing down to 50 kHz raw beatnote signal 316 resulting from the above-mentioned optical cavity having a nominal FSR of 2.6733 GHz. As with the reference input 352, the frequency stability of mixer 320 contributes a source of system noise for the stabilization system. Alternatively, mixer 320 can be substituted with a frequency scaler which can be used to divide down (or multiply up) the center frequency of raw beatnote signal 316. Although frequency scaling, rather then mixing, is possible due to the typically high signal-to-noise ratio of photodetector 314, additional amplification gain must be included in negative feedback system 350 since variations in the optical length 230 (cavity noise as represented in the modulated center frequency of the beatnote signal 310 ) will also be divided down proportionately by the frequency scaler.

In the embodiment of FIG. 3, electronic oscillator 356 optionally contains additional stabilization mechanism 368 which is used to further stabilize the frequency of natural oscillator 360. Quartz, being the preferred oscillator, may be mastered for long term stability to atomic transitions. Stabilization mechanism 368 may include, therefore, a Rubidium or Cesium based, long-term stabilization mechanism which allows the natural oscillator to be phase locked to an atomic or molecular transition frequency.

Applications for the apparatus and method of the present invention are numerous. In particular, useful optical output 292 of FIG. 3 may be input to a long-baseline interferometer 400 which may be used to make precision relative distance measurements. Useful optical output 292 may also be used to control elements of semiconductor fabrication machinery, such as the position of the optical systems involved in the semiconductor masking processes. Additionally, combined optical output 298 may be input to a fiber optics distribution system 402 for distribution to other systems which need to maintain a timing reference using the system of the present invention as a frequency control source. Such remote systems may include telecommunications applications which require accurate and stable timing references that need to be distributed in a wideband fashion.

Other useful applications of the present invention include the frequency measurement of additional lasers using useful optical output 292 as a first optical output input to a second beatnote generator. The optical output of the laser to be measured would also be input to the second beatnote generator and the resulting beatnote frequency would be usable as a measure of the difference between the two frequencies. Since the first reference laser has been stabilized according to the apparatus and method of this invention, the change in the frequency of the additional laser would be easily measured by the beatnote signal.

Further applications may likewise employ other lasers locked to different resonant frequencies of additional optical resonators. Additional laser outputs can be mixed using additional beatnote generators and one of the first two locked and stabilized lasers of FIG. 3 (a reference laser) as one input, such that a stable beatnote signal (oscillator) at any frequency from nearly DC up to the sum of the frequencies of the reference laser and the additionally locked laser, can be produced from the additional beatnote generator. The additional optical resonator of this multilaser embodiment is modulated to an optical length such that one of its modes is chosen to differ from the center frequency of reference laser by the desired output frequency. After the first two lasers are locked according to the above, additional lasers are locked to a resonant mode frequency, resulting in a beatnote signal, created from the reference laser at resonant mode m and the additional laser at resonant mode n. This multiple method thereby allows for the creation of stable, tunable reference oscillators of almost any desirable frequency.

With reference to FIG. 1, a preferred method of controlling the frequency of one or more lasers will now be described. First and second laser outputs 62 and 72 from first and second laser systems 60 and 70 are provided. First and second laser frequencies are independently locked to a respective first and second resonant mode of an optical resonator 20. A beatnote signal 110 is then produced from the first and second locked laser frequencies and represents a difference between them. Beatnote signal 110 is input to negative feedback system 150 along with a reference signal 152. Negative feedback system 150 locks the beatnote signal 110 and reference signal 152 and outputs modulation signal 56 to actuate modulation device 50 attached to optical resonator 20 and disposed to vary an optical length 30. Modulation device 50 modulates optical length 30 of said optical resonator 20 in response to the modulation signal 56 so as to lock the optical resonator 20 to the reference signal 152 through negative feedback system 150.

In the embodiment of FIG. 3, optional optical conditioning system 295 is provided to perform the step of conditioning at least one of said first and second respective laser outputs 262 and 272. The step of conditioning at least one of said first and second laser outputs may also further comprise the steps of coaligning the first and second laser outputs 262 and 272 with beam combiner 294 so as to be properly direct the combined first and second laser outputs 296 into optical cavity 20. In addition, the step of directing the coaligned first and second laser outputs as combined optical signal 297 to beatnote generator 300 through beam combiner 295 may be included. Further, the step of conditioning said first and second laser outputs may also include the steps of coaligning the first and second laser outputs 262 and 272 with beam combiner 295 or other optics and inputting said coaligned first and second laser outputs 292 to an optical distribution mechanism 400 after the step of locking optical resonator 20 to reference signal 352 has been performed.

Further, in a preferred embodiment of FIG. 3, the step of producing beatnote signal 310 according to the method of the present invention preferably comprises the step of mixing down a center frequency of raw beatnote signal 316 with mixer 320 so as to preserve information related to changes in the optical length 230 of said optical resonator 220. Alternatively, the step of producing a beatnote signal may comprise the step of scaling down a center frequency of the raw beatnote signal 316 from photodetector 314 with scaler 320 so as to preserve information related to changes in said optical length 230 of the optical resonator 220.

Additional embodiments of the method of the present invention as shown in FIG. 3 include modifications to the step of locking the beatnote signal 310 to the reference signal 352 by the negative feedback system 350 and include the steps of first achieving a quasi-steady-state lock with the integral feedback portion and subsequently achieving a steady-state-lock with proportional control portion of elements 190 and 194 in FIG. 2,. Further, the step of locking the first and second laser frequencies with locking mechanisms 68 and 78 respectively may include the step of applying a Pound-Drever Hall locking method.

Useful applications of the method of the present invention are numerous. In particular, the method of the present invention may include the step of utilizing at least one of the first and second laser outputs 262 and 272, to measure a distance by directing at least one of the first and second laser outputs 262 and 272 to a measuring device 400. The method of the present invention may also include the step of utilizing at least one of the first and second laser outputs 262 or 272, or optically combined first and second laser outputs 298, as stable frequency reference inputs to a communications system 401 after the optical resonator 220 has been locked to the reference signal 352. A final application step of the method of the present invention may include the step of mixing at least one of the first or second laser outputs 262 and 272 with another laser output (not shown) to determine the frequency of the another laser after the optical resonator 220 has been locked to the reference signal 352.

While the particular embodiments and methods of the invention have been shown and described, it will be obvious to those skilled in the art that the specific terms and figures are employed in a generic and descriptive sense only and not for the purposes of limiting or reducing the scope of the broader inventive aspects herein. By disclosing the preferred embodiments and steps of the present invention above, it is not intended to limit or reduce the scope of coverage for the general applicability of the present invention. Persons of skill in the art will easily recognize the substitution of similar components and steps in the apparatus and methods of the present invention.

What is claimed is:

1. A laser frequency control apparatus comprising:
   (a) an optical resonator having an optical length and a plurality of resonant modes dependent upon said optical length;
   (b) a first laser system including a first laser output at a first laser frequency and a first laser locking mechanism, said first laser locking mechanism adapted to modulate said first laser output so as to lock said first laser frequency to a first resonant mode of said optical resonator;
   (c) a second laser system including a second laser output at a second laser frequency and a second laser locking mechanism, said second laser locking mechanism adapted to modulate said second laser output so as to lock said second laser frequency to a second resonant mode of said optical resonator;
   (d) a beatnote generator arranged to receive said first and second laser outputs and produce a beatnote signal representative of the difference between said first and second laser frequencies;
   (e) a modulation device adapted to modulate said optical length so as to maintain a specific optical length; and
   (f) a negative feedback system having said beatnote signal and a reference signal as input signals and producing a modulation signal to actuate said modulation device to modulate said optical length responsive to said beatnote signal so as to lock said optical resonator to said reference signal.

2. The laser frequency control apparatus of claim 1 wherein said apparatus further comprises an optical conditioning system operatively arranged to condition at least one of said first and second laser outputs.

3. The laser frequency control apparatus of claim 1 wherein said negative feedback system comprises a phase-locked loop having an electronic oscillator adapted to produce said reference signal, said modulation signal being representative of a difference between said beatnote and said reference signals.

4. The laser frequency control apparatus of claim 1 wherein said negative feedback system comprises an integral feedback portion and a proportional feedback portion.

5. The laser frequency control apparatus of claim 1 wherein said beatnote generator comprises a photodetector.

6. The laser frequency control apparatus of claim 1 wherein said optical resonator is comprised of material having a low coefficient of thermal expansion.

7. The laser frequency control apparatus of claim 1 wherein said optical resonator is less than about 100 millimeters long.

8. The laser frequency control apparatus of claim 1 wherein said modulation device further comprises an optical length transducer operatively coupled to said optical resonator and being adapted to modulate said optical length in response to said modulation signal.

9. The laser frequency control apparatus of claim 1 wherein at least one of said first and second laser systems comprises a diode-pumped ring laser.

10. The laser frequency control apparatus of claim 1 wherein said optical resonator has a finesse greater than about 5,000.

11. The laser frequency control apparatus of claim 1 wherein at least one of said first and second laser locking mechanisms comprise a Pound-Drever-Hall locking mechanism.

12. The laser frequency control apparatus of claim 1 wherein said apparatus has a volume smaller than about 2700 cubic centimeters.

13. The laser frequency control apparatus of claim 1 wherein at least one of said first and second resonant modes is an axial mode of said optical resonator.

14. The laser frequency control apparatus of claim 1 wherein at least one of said first and second resonant modes is an off-axis mode of said optical resonator.

15. The laser frequency control apparatus of claim 1 wherein at least one of said first and second resonant modes is a degenerate off-axis mode of said optical resonator.

16. The laser frequency control apparatus of claim 2 wherein said optical conditioning system comprises at least one beam combiner adapted to coalign said first and second laser outputs.

17. The laser frequency control apparatus of claim 2 wherein said optical conditioning system comprises an optical distribution mechanism adapted to distribute at least one of said first or second laser outputs to an system removed from said laser frequency control apparatus.

18. The laser frequency control apparatus of claim 3 wherein said beatnote signal has a center frequency, said center frequency modulated by changes in said optical length.

19. The laser frequency control apparatus of claim 8 wherein said optical length transducer comprises a piezoelectric material.

20. The laser frequency control apparatus of claim 18 wherein said electronic oscillator comprises a natural oscillator and a clock scaler adapted to produce said reference signal at a frequency matched with said beatnote signal center frequency.

21. The laser frequency control apparatus of claim 18 further comprising a mixer operatively coupled between said beatnote generator and said negative feedback system and adapted to mix down said beatnote signal center frequency.

22. The laser frequency control apparatus of claim 18 further comprising a scaler operatively coupled between said beatnote generator and said negative feedback system and adapted to scale down said beatnote signal center frequency.

23. The laser frequency control apparatus of claim 18 wherein at least one of said first and second laser outputs is an input to a long-baseline interferometer adapted to measure a distance.

24. The laser frequency control apparatus of claim 18 wherein at least one of said first and second laser outputs and said beatnote signal is a reference input to a communications system.

25. The laser frequency control apparatus of claim 18 wherein said at least one of first and second laser outputs is an input to a frequency measurement system for another laser.

26. The laser frequency control apparatus of claim 20 wherein said electronic oscillator further comprises a stabilization mechanism adapted to stabilize said natural oscillator.

27. A method of laser frequency control comprising the steps of:
(a) providing a first laser output having a first laser frequency;
(b) locking said first laser frequency to a first resonant frequency of an optical resonator;
(c) providing a second laser output having a second laser frequency;
(d) locking said second laser frequency to a second resonant frequency of said optical resonator;
(e) producing a beatnote signal representative of the difference between said first and second laser frequencies;
(f) inputting said beatnote signal and a reference signal into a negative feedback system;
(g) producing a modulation signal representative of the difference between said beatnote and reference signals;
(h) locking said beatnote signal to said reference signal with said negative feedback system; and
(i) actuating modulation device in response to said modulation signal to modulate an optical length of said optical resonator so as to lock said optical resonator to said reference signal.

28. The method of laser frequency control of claim 27 further comprising the step of conditioning at least one of said first and second laser outputs.

29. The method of laser frequency control of claim 27 further comprising the step of utilizing at least one of said first and second laser outputs to measure a distance after locking said optical resonator to said reference signal.

30. The method of laser frequency control of claim 27 further comprising the step of utilizing at least one of said first and second laser outputs to establish a communication system reference after locking said optical resonator to said reference signal.

31. The method of laser frequency control of claim 27 further comprising the step of mixing at least one of said first or second laser outputs with another laser output to determine a frequency of said another laser after locking said optical resonator to said reference signal.

32. The method of laser frequency control of claim 27 wherein the step of locking said beatnote signal to said reference signal comprises the sequential steps of:
(a) achieving a quasi-steady-state lock with an integral feedback portion of said negative feedback system; and then
(b) achieving a steady-state lock with a proportionate control portion of said negative feedback system.

33. The method of laser frequency control of claim 28 wherein the step of locking at lease one of said first and second laser frequencies comprises the step of applying a Pound-Drever-Hall locking method.

34. The method of laser frequency control of claim 28 wherein the step of conditioning at least one of said first and second laser outputs comprises the steps of:
(a) coaligning said first and second laser outputs; and
(b) directing said coaligned first and second laser outputs to the beatnote generator.

35. The method of laser frequency control of claim 28 wherein the step of conditioning at least one of said first and second laser outputs comprises the step of:
(a) coaligning said first and second laser outputs; and
(b) inputting said coaligned first and second laser outputs to an optical distribution mechanism, after locking said optical resonator to said reference signal.

36. The method of laser frequency control of claim 32 wherein the step of producing a beatnote signal comprises the step of mixing down a center frequency of said beatnote signal so as to preserve information related to changes in said optical length of said optical resonator.

37. The method of laser frequency control of claim 32 wherein the step of producing a beatnote signal comprises the step of scaling down a center frequency of said beatnote signal so as to preserve information related to changes in said optical length of said optical resonator.

* * * * *